United States Patent
Lee et al.

(10) Patent No.: US 7,247,881 B2
(45) Date of Patent: Jul. 24, 2007

(54) ORGANIC LIGHT-EMITTING DISPLAY WITH PAD AREA AND FABRICATING METHOD OF SAME

(75) Inventors: Kwan-Hee Lee, Seoul (KR); Won-Kyu Kwak, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 267 days.

(21) Appl. No.: 10/989,644

(22) Filed: Nov. 17, 2004

(65) Prior Publication Data
US 2005/0110023 A1    May 26, 2005

(30) Foreign Application Priority Data
Nov. 24, 2003  (KR) ............... 10-2003-0083792

(51) Int. Cl.
*H01L 29/04* (2006.01)
(52) U.S. Cl. .................. 257/72; 257/49; 257/66; 257/E29.151; 438/142; 438/149; 438/151; 438/166
(58) Field of Classification Search .......... None
See application file for complete search history.

(56) References Cited
U.S. PATENT DOCUMENTS

| | | | | |
|---|---|---|---|---|
| 5,821,622 A * | 10/1998 | Tsuji et al. | .......... | 257/763 |
| 6,599,767 B1 * | 7/2003 | Li | .......... | 438/22 |
| 2004/0004432 A1 * | 1/2004 | Park et al. | .......... | 313/504 |
| 2005/0045882 A1 * | 3/2005 | Park et al. | .......... | 257/59 |

* cited by examiner

*Primary Examiner*—Leonardo Andujar
*Assistant Examiner*—Kevin Quinto
(74) *Attorney, Agent, or Firm*—H.C. Park & Associates, PLC

(57) ABSTRACT

An organic light-emitting display including a substrate, at least one thin film transistor, a pixel electrode and at least one pad electrode. The substrate is provided with a display area and a pad area spaced apart from the display area. The thin film transistor is disposed on the display area of the substrate, and includes an active layer, a gate electrode and source/drain electrodes. The pixel electrode is adjacent to the thin film transistor, and is electrically connected to the thin film transistor. The pad electrode is disposed on the pad area of the substrate, is formed of the same layer as the gate electrode or the source/drain electrodes, and is coupled with an external module.

33 Claims, 18 Drawing Sheets

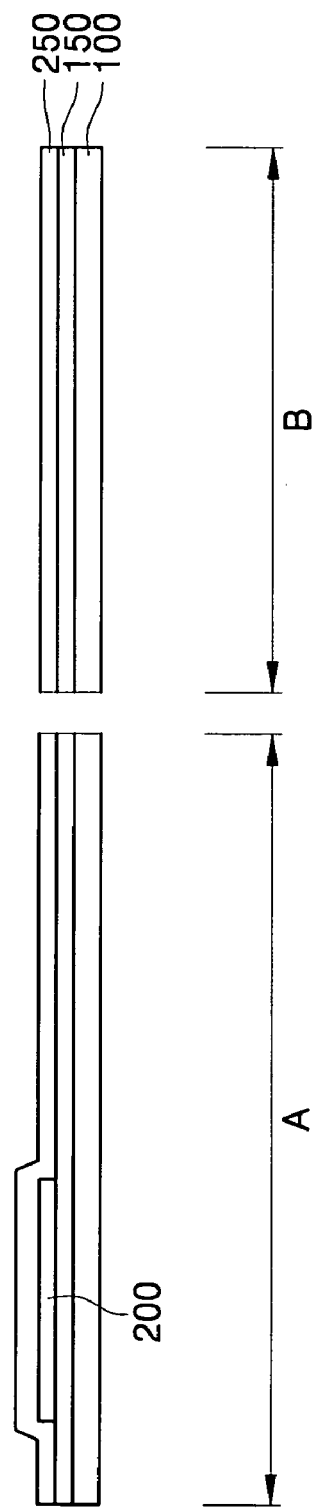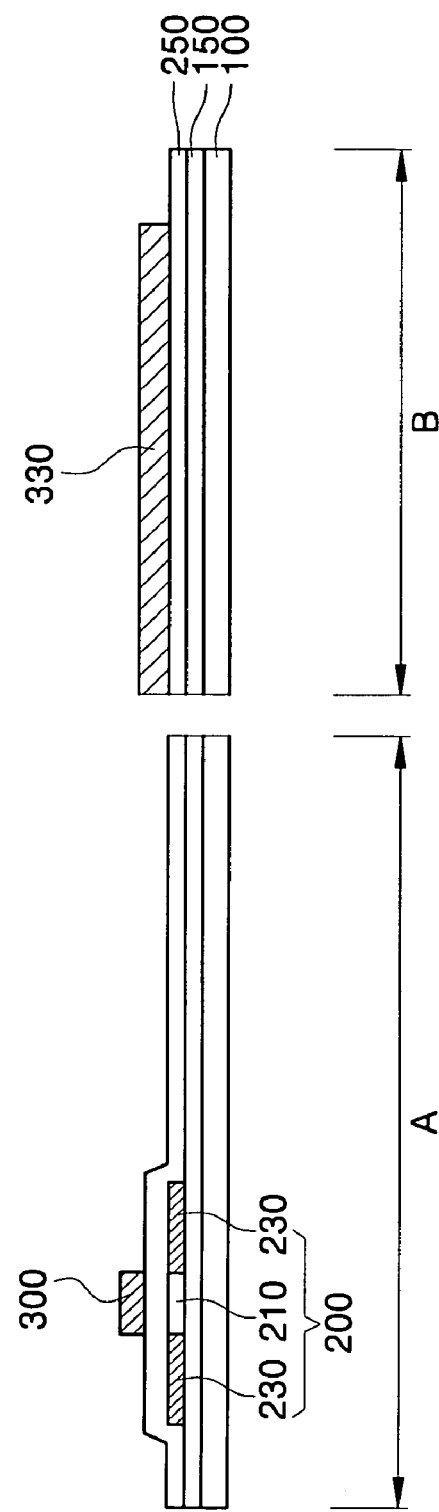

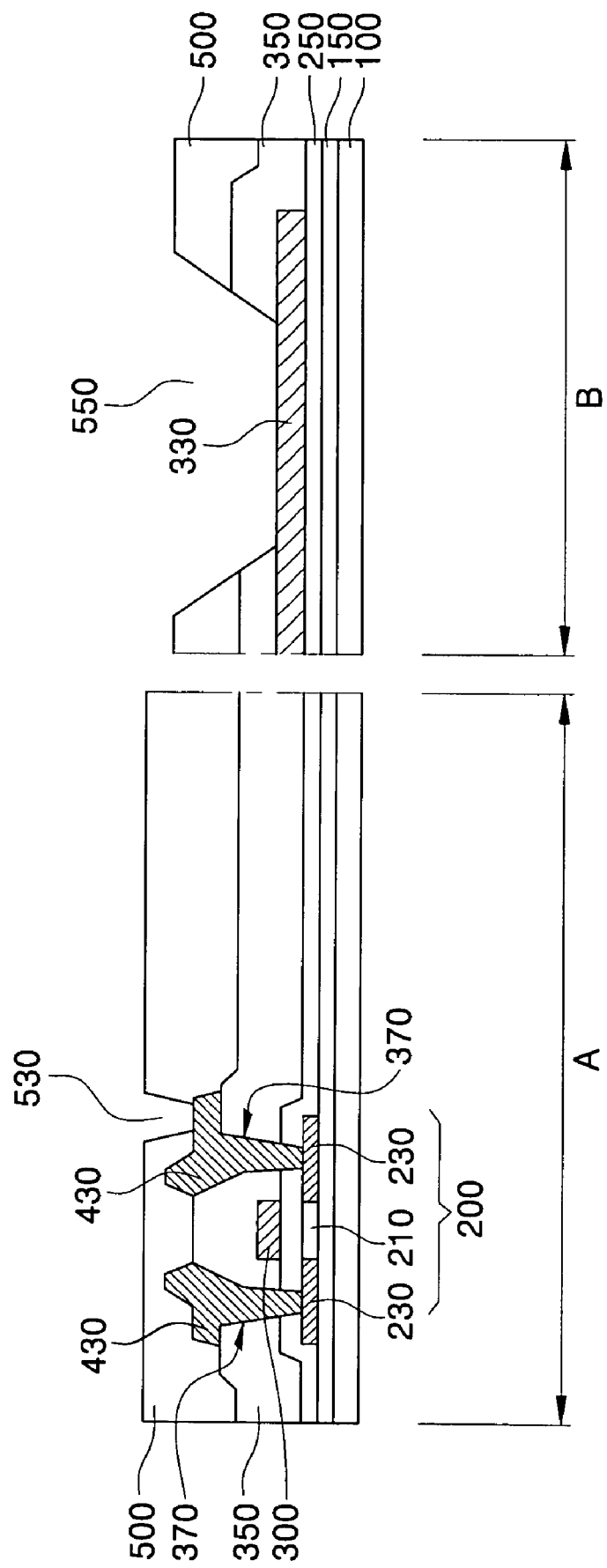

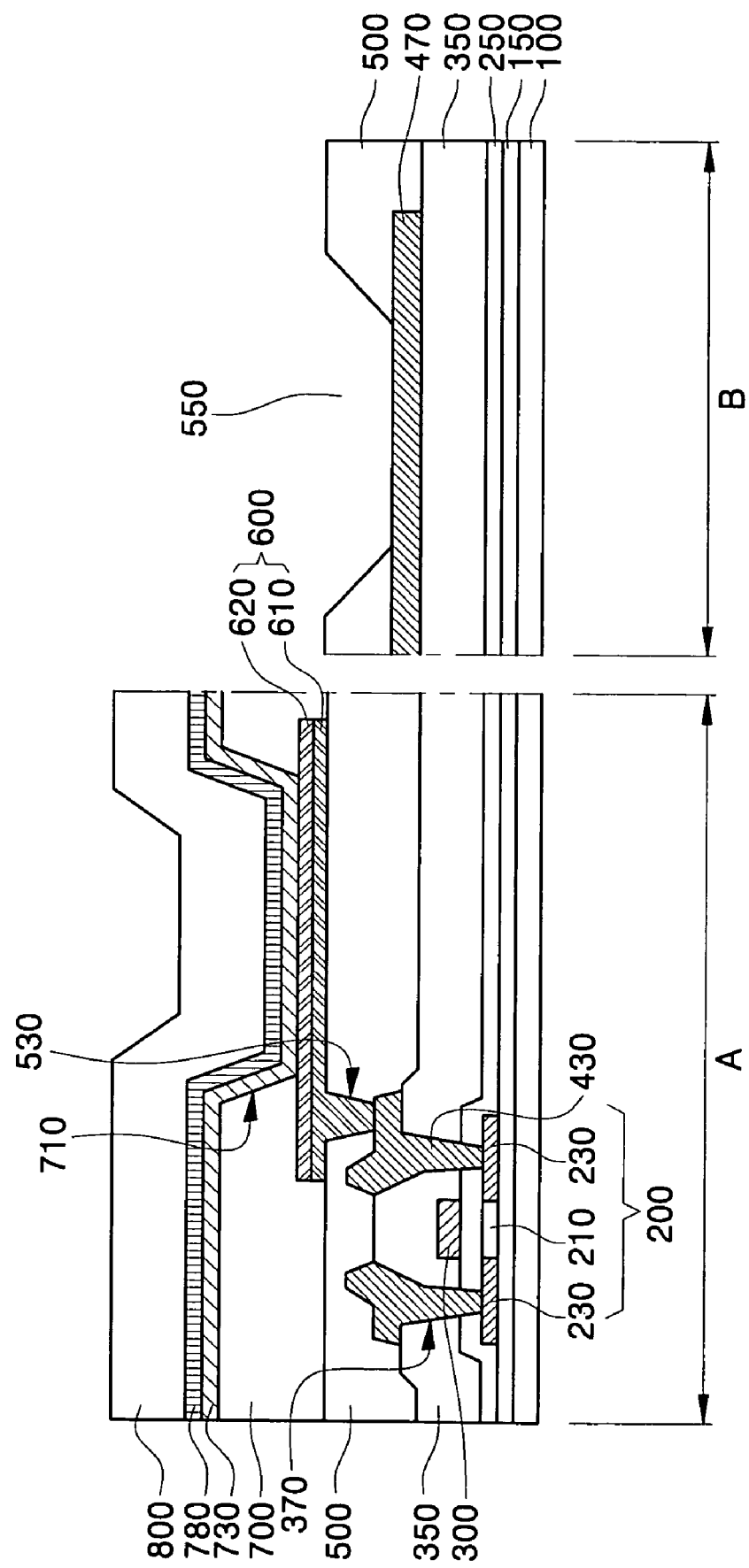

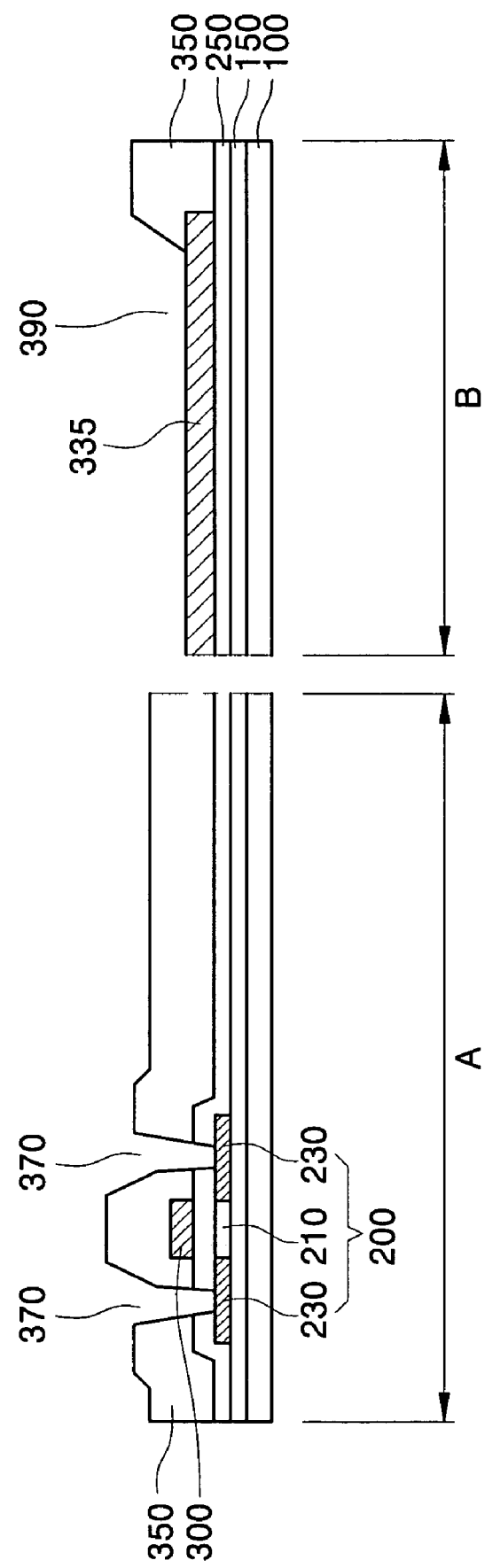

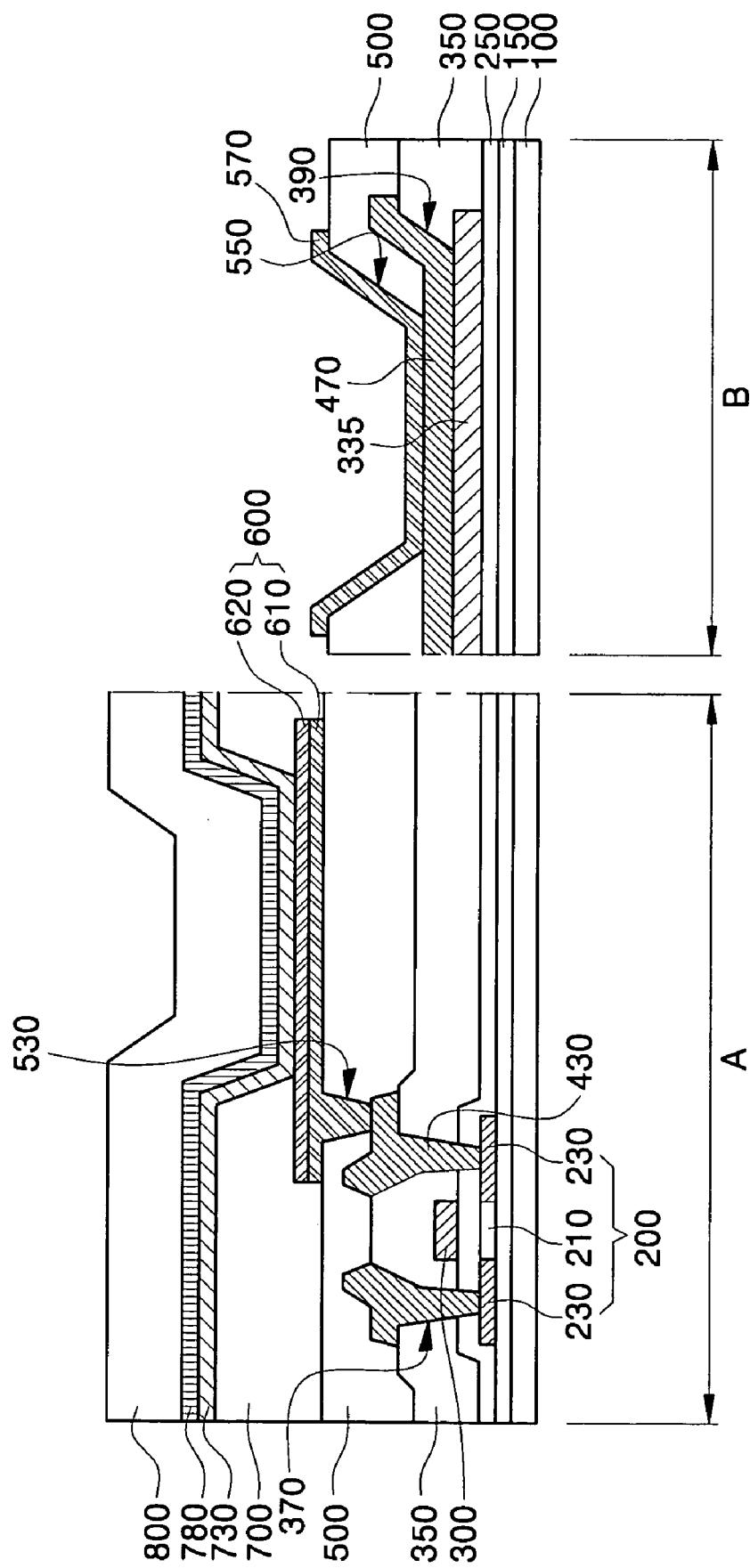

ORGANIC LIGHT-EMITTING DISPLAY WITH PAD AREA AND FABRICATING METHOD OF SAME

This application claims the benefit of Korean Patent Application No. 2003-83792, filed on Nov. 24, 2003, which is hereby incorporated by reference for all purposes as if fully set forth herein.

BACKGROUND OF THE INVENTION

1. Field of the Invention

The present invention relates to a flat panel display and method of fabricating the same and, more particularly, to an organic light-emitting display and method of fabricating the same.

2. Discussion of the Related Art

Generally, organic light-emitting displays (OLED) are emissive displays that emit light by electrically exciting a fluorescent organic compound. OLEDs are considered either active matrix or passive matrix depending upon a mode for driving the pixels, which are arranged in a matrix. The active-matrix OLED has lower power consumption than the passive-matrix OLED, so it is more suitable as a large display having high resolution. OLEDs may be further divided into three types, a top emitting type, a bottom emitting type and a double-side emitting type, according to a propagation direction of light emitted from the organic compound. The top-emitting OLED, unlike the bottom-emitting OLED, is capable of emitting light in a direction opposite to the substrate on which the unit pixels are arranged, and it has a high aperture ratio.

In the top-emitting OLED, a pixel electrode may be formed with a conductive material having excellent reflectivity and a proper work function. However, no single material seems to satisfy these characteristics. Thus, the top-emitting OLED typically employs a multilayer pixel electrode.

FIG. 1 is a cross-sectional view of a conventional active-matrix OLED having a multilayer pixel electrode and method of fabricating the same.

Referring to FIG. 1, a substrate 10 is provided with a display area A and a pad area B. An active layer 20 is formed on the display area A, wherein the active layer has source/drain regions 23 and a channel region 21. A gate insulating layer 25 is formed on the entire surface of the substrate, and a gate electrode 30, corresponding to the channel region 21, is formed on the gate insulating layer 25. Subsequently, an interlayer 35 is formed on the entire surface of the substrate, and source/drain contact holes, which expose the source/drain regions 23, are formed in the interlayer 35.

Next, source/drain electrodes 43 are formed on the interlayer 35, wherein the source/drain electrodes 43 contact the source/drain regions 23 through the source/drain contact holes. Simultaneously, a pad electrode 47 is formed on the interlayer 35 of the pad area B. A planarization layer 50 is formed on the entire surface of the substrate and a via hole 53, which exposes any one of the source/drain electrodes 43, and a pad contact hole 55, which exposes the pad electrode 47, are formed in the planarization layer 50.

Subsequently, an aluminum-neodymium (AlNd) layer and an indium tin oxide (ITO) layer are sequentially deposited and patterned on the planarization layer 50. As a result, a pixel electrode 60, coupled to the source/drain electrode 43 exposed by the via hole 53, is formed on the planarization layer 50 of the display area A, and simultaneously, a terminal pad 65, coupled to the pad electrode 47 through the pad contact hole 55, is formed on the planarization layer 50 of the pad area B. Thus, the pixel electrode 60 and the terminal pad 65 are formed with the AlNd layer 61, 66 and the ITO layer 62, 67. Hence, the AlNd layer 61, as a reflection layer, reflects light emitted from an emission layer thereby forming a top-emitting OLED, which emits light in a direction opposite to the substrate 10.

The terminal pad 65 is bonded with an external module after the OLED is fabricated, and it transmits an electrical signal inputted from the external module. Thus, the terminal pad 65 may be vulnerable to external moisture or oxygen. As set forth above, the terminal pad 65 is formed with the AlNd layer 66 and the ITO layer 67. These layers may be exposed to moisture at the same time, particularly at a lateral surface P of the terminal pad 65. In this case, a galvanic phenomenon may be generated between the AlNd layer 66 and the ITO layer 67. This phenomenon appears when two materials having different electromotive force (EMF) are simultaneously exposed to a corrosive solution. The material having a greater EMF is subjected to corrosion.

Thus, when the terminal pad 65 corrodes, it is possible to decrease its reliability after bonding with the external module. This leads to defects in the OLED, and causes a decrease in yield. A decrease in pad reliability may also be generated when the pad electrode has a single layer structure composed of a material sensitive to external moisture or oxygen.

SUMMARY OF THE INVENTION

The present invention provides an OLED having improved pad reliability.

Additional features of the invention will be set forth in the description which follows, and in part will be apparent from the description, or may be learned by practice of the invention.

The present invention provides an OLED comprising a substrate provided with a display area and a pad area spaced apart from the display area. At least one thin film transistor, which includes an active layer, a gate electrode and source/drain electrodes, is disposed on the display area of the substrate. A pixel electrode, which is electrically coupled to the thin film transistor, is neighboring the thin film transistor. At least one pad electrode is disposed on the pad area of the substrate and formed of the same layer as any one of the gate electrode and the source/drain electrodes. The pad electrode is coupled with an external module.

The present invention also provides an OLED comprising a substrate provided with a display area and a pad area spaced apart from the display area. At least one thin film transistor, which includes an active layer, a gate electrode and source/drain electrodes, is disposed on the display area of the substrate. A pixel electrode, which is electrically coupled to the thin film transistor and has a layered structure of at least two conductive layers, neighbors the thin film transistor. A pad electrode, which is formed of the same layer as any one of the gate electrode and the source/drain electrodes, is disposed on the pad area. A terminal pad, which is formed of the same layer as any one of the conductive layers of the pixel electrode, is disposed on the pad electrode, and is coupled with an external module.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3A, FIG. 3B, FIG. 3C, FIG. 3D, FIG. 3E and FIG. 3F are cross-sectional views showing an OLED and method of fabricating the same according to a first exemplary embodiment of the present invention.

FIG. 6A and FIG. 6B are cross-sectional views illustrating an OLED according to a fourth exemplary embodiment of the present invention and method for fabricating the same.

FIG. 9A, FIG. 9B and FIG. 9C are a cross-sectional views illustrating an OLED according to a seventh exemplary embodiment of the present invention and method for fabricating the same.

FIG. 10 is a cross-sectional view illustrating an OLED according to an eighth exemplary embodiment of the present invention and method for fabricating the same.

DETAILED DESCRIPTION OF THE INVENTION

The present invention will now be described with reference to the accompanying drawings, which show preferred embodiments of the invention. This invention may, however, be embodied in different forms and should not be construed as limited to the exemplary embodiments set forth herein. In the description and drawings, when a layer is disposed "on" another layer or a substrate, it may be directly formed on the other layer or the substrate, or it may be formed other layers or substrates that are interposed between them. Like reference numbers refer to like elements throughout the specification.

Figure 2:
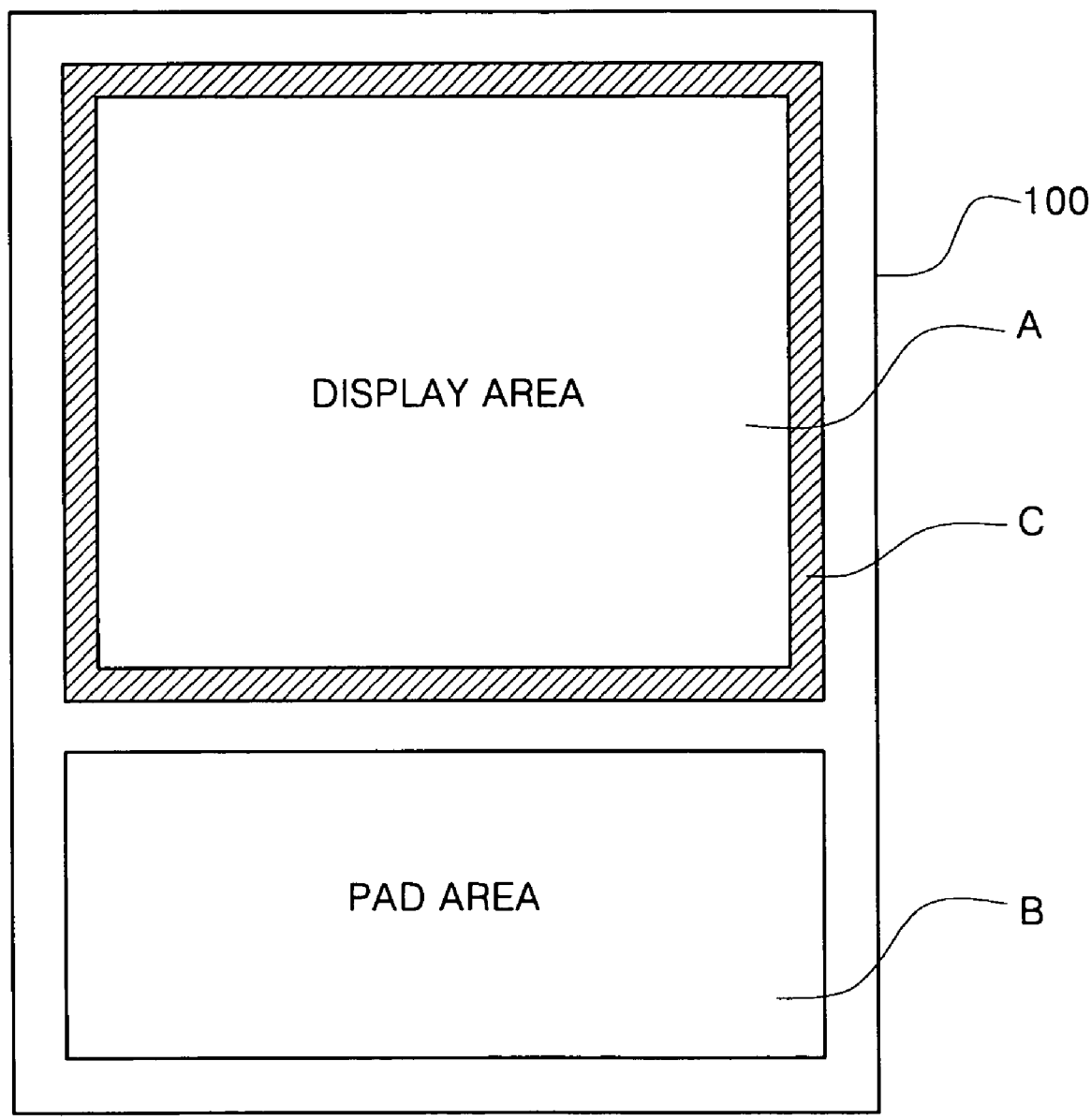
FIG. 2 is a plan view showing an OLED according to exemplary embodiments of the present invention.

FIG. 2 is a top plan view showing an OLED according to exemplary embodiments of the present invention.

Referring to FIG. 2, a display area A is positioned on a predetermined region of a substrate 100 for displaying images. The display area A has a unit pixel array (not shown) and a driving circuit (not shown) around the unit pixel array, wherein the unit pixel array has unit pixels arranged in a matrix, and the driving circuit drives the unit pixels. Each unit pixel is composed of at least one thin film transistor (not shown) and a pixel electrode (not shown) electrically coupled to it. The thin film transistor includes an active layer (not shown), a gate electrode (not shown) and source/drain electrodes (not shown). The pixel electrode may have at least one layered structure of conductive layers.

An encapsulation area C, which protects the unit pixels in the display area A from external moisture and oxygen, encloses the display area A. Further, a sealant that bonds the substrate 100 and an encapsulation substrate (not shown) is applied at the encapsulation area C.

A pad area B is located outside of the display area A and the encapsulation area C, and it is a region for coupling an external module (not shown), which applies an electrical signal, to the display area A. There are disposed various wirings (not shown) for transmitting the electrical signal between the display area A and the pad area B.

The pad area B has at least one pad electrode that is electrically coupled with these wirings. The pad electrode may be formed of the same layer as the gate electrode or source/drain electrode. When the pad electrode is formed of the same layer as the source/drain electrode, a gate pad may be disposed under the pad electrode and formed of the same layer as the gate electrode. The pad electrode or the gate pad may be electrically coupled with the wirings. A terminal pad may be disposed on the pad electrode, and formed of the same layer as any one layer of the pixel electrode. In this case, the terminal pad may be coupled with the external module. However, without the terminal pad, the pad electrode is coupled with the external module.

FIG. 3A, FIG. 3B, FIG. 3C, FIG. 3D, FIG. 3E and FIG. 3F are cross-sectional views showing an OLED and method of fabricating the same according to a first exemplary embodiment of the present invention. FIGS. 3A to 3F are limited to a unit pixel of the display area A and the pad area B in FIG. 2.

Referring to FIG. 3A, a substrate 100 has a display area A and a pad area B. The substrate 100 may be an insulating substrate, such as a glass or plastic substrate. A buffer layer 150 is formed on the entire surface of the substrate 100 to protect a subsequently formed thin film transistor from impurities, such as alkaline ions, which are eluted from the substrate 100, and it may be formed of a silicon oxide layer or a silicon nitride layer. An active layer 200, which may be formed of amorphous silicon or polycrystalline silicon, is formed on the display area A of the substrate 100. A gate insulating layer 250 is then formed on the entire surface of the substrate 100.

Referring to FIG. 3B, a gate electrode layer is deposited and patterned to simultaneously form a gate electrode 300 on the gate insulating layer 250 of the display area A, and a pad electrode 330 on the gate insulating layer 250 of the pad area B. The pad electrode 330 is electrically coupled with at least one wiring (not shown) connecting the pad area B with the display area A. The wiring may be a common power supply wiring or data wiring. The gate and pad electrodes 300 and 330 are preferably formed of a material that is insensitive to moisture and has excellent conductivity. More preferably, they are formed of a molybdenum alloy. Most preferably, the molybdenum alloy is a molybdenum-tungsten alloy.

Impurities may then be injected into the active layer 200, using the gate electrode 300 as a mask to form source/drain regions 230 and define a channel region 210 between the source/drain regions 230.

Figure 3C:
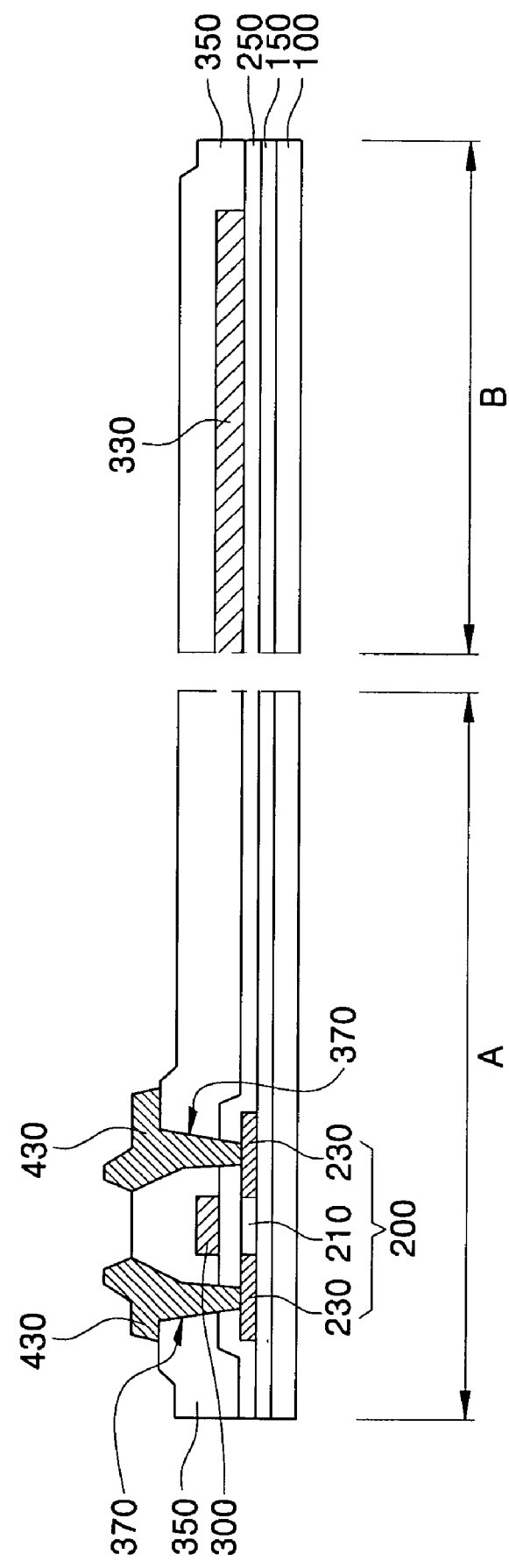

Referring to FIG. 3C, an interlayer 350 is formed to cover the gate and pad electrodes 300 and 330. Source/drain contact holes 370, which expose the source/drain regions 230, are formed in the interlayer 350 and the gate insulating layer 250. A source/drain electrode layer is then deposited and patterned on the interlayer 350 to form source/drain electrodes 430, which are connected to the source/drain regions 230 exposed by the contact holes 370, respectively.

Referring to FIG. 3D, a planarization layer 500 is formed on the entire surface of the substrate 100, and a photoresist pattern (not shown) is then formed on the planarization layer 500, wherein the photoresist pattern exposes predetermined regions of the display area A and the pad area B. The planarization layer 500 of the exposed display area A is etched, using the photoresist as an etching mask, to form a via hole 530, which exposes any one of the source/drain electrodes 430. Simultaneously, the planarization layer 500 and the interlayer 350 of the exposed pad area B are etched using the photoresist as an etching mask to form a pad contact hole 550, which exposes the pad electrode 330.

Figure 3E:
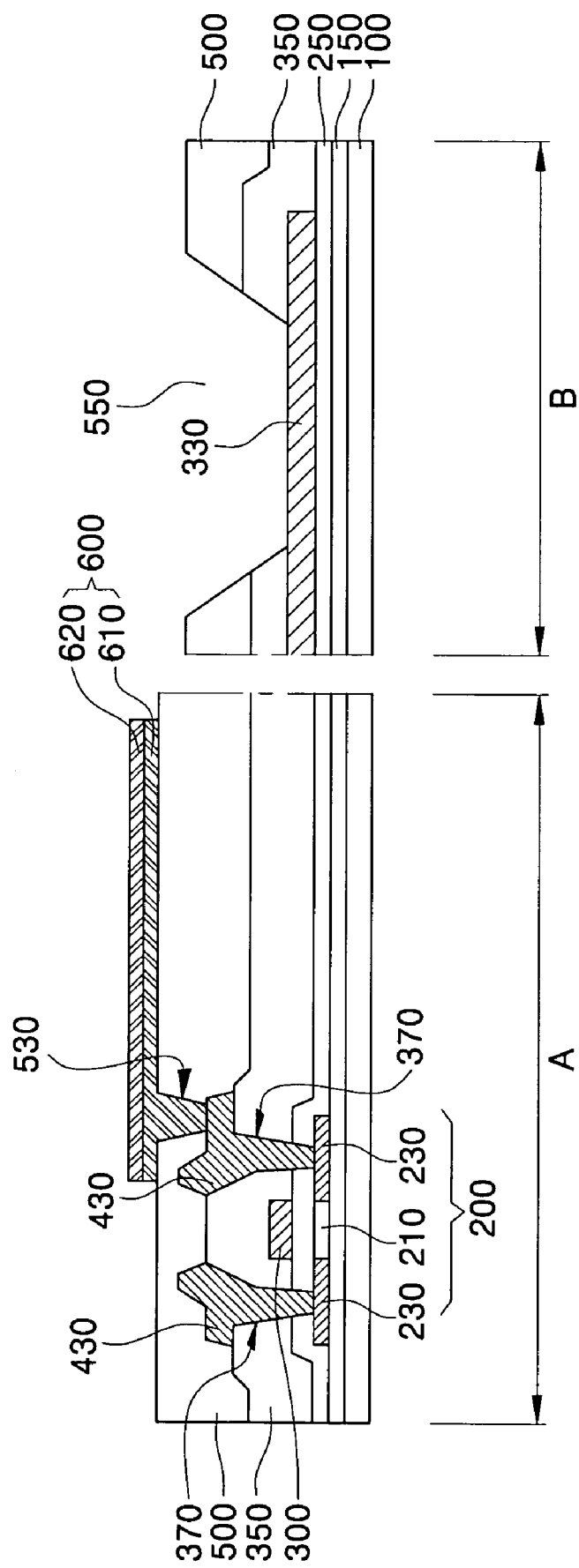

Referring to FIG. 3E, a first pixel electrode layer 610 may be deposited on the planarization layer 500 in the display area A by means of sputtering or vacuum deposition, and a second pixel electrode layer 620 may be deposited on the first pixel electrode layer by the same means. The first and second pixel electrode layers 610, 620 are deposited using a high precision mask, so that the display area A, but not the pad area B, is provided with the pixel electrode layers. The pixel electrode 600, which is comprised of the first and second pixel electrode layers 610, 620, is coupled with one of the source/drain electrodes 430 exposed by the via hole 530.

The first pixel electrode layer pattern 610 may be formed of a conductive reflection layer, while the second pixel electrode layer pattern 620 may be formed of a conductive transparent layer. Therefore, light emitted from a subsequently formed emission layer may be reflected from the conductive reflection layer toward a direction opposite to the substrate 100. Preferably, the conductive reflection layer is formed of any one selected from a group consisting of aluminum (Al), aluminum alloy, silver (Ag), silver alloy and their alloys, which have a reflectivity of at least 60%. More preferably, the conductive reflection layer is formed of aluminum-neodymium (AlNd). The conductive transparent layer is preferably formed of ITO or indium zinc oxide (IZO), which has a work function allowing holes to be easily injected into the subsequently formed organic emission layer.

Alternatively, the pixel electrode 600 may be formed of one conductive layer.

Figure 3F:
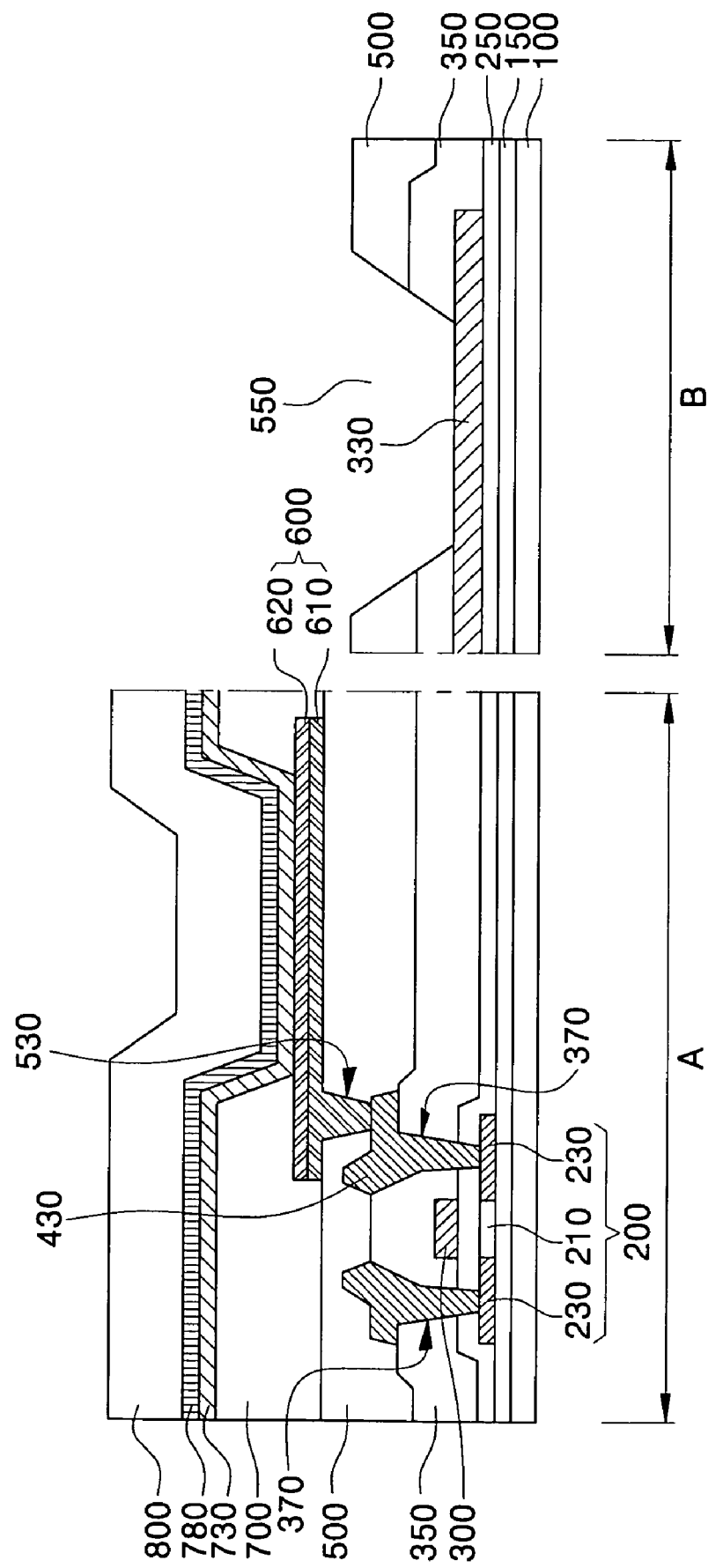

Referring to FIG. 3F, a pixel defining layer 700 is formed on the entire surface of the substrate 100. Next, an opening that exposes a surface of the pixel electrode 600 is formed within the pixel defining layer 700 of the display area A, and simultaneously, the pixel defining layer 700 is removed from the pad area B to expose the pad electrode 330. An organic functional layer 730, having at least an emission layer, is then formed on the portion of the pixel electrode 600 exposed in the opening. The organic functional layer 730 may also include a charge injecting layer and/or a charge transporting layer. An opposite electrode 780 is formed on the organic functional layer 730. The opposite electrode 780 may function as a cathode when the pixel electrode 600 functions as an anode and it may function as an anode when the pixel electrode 600 functions as a cathode.

A passivation insulating layer 800 is formed on the entire surface of the substrate, and then removed from the pad area B to expose the pad electrode 330.

Subsequently, an encapsulation area C (shown in FIG. 2) of the substrate is covered with a sealant, and the substrate and an encapsulation substrate are bonded together by means of the sealant. The sealant is then cured to finish the encapsulation, which may prevent external oxygen and/or moisture from penetrating the display area A. Thus, the encapsulation may prevent the organic functional layer 730 and the pixel electrode 600 from reacting with oxygen and/or moisture, which improves characteristics of the OLED, such as its life span.

The encapsulation substrate does not encapsulate any part of the pad area B, therefore, it is exposed. The exposed pad electrode 330 is bonded with an external module, which may be chip on glass (COG), Flexible Printed Circuit (FPC) or other similar modules.

Figure 1:
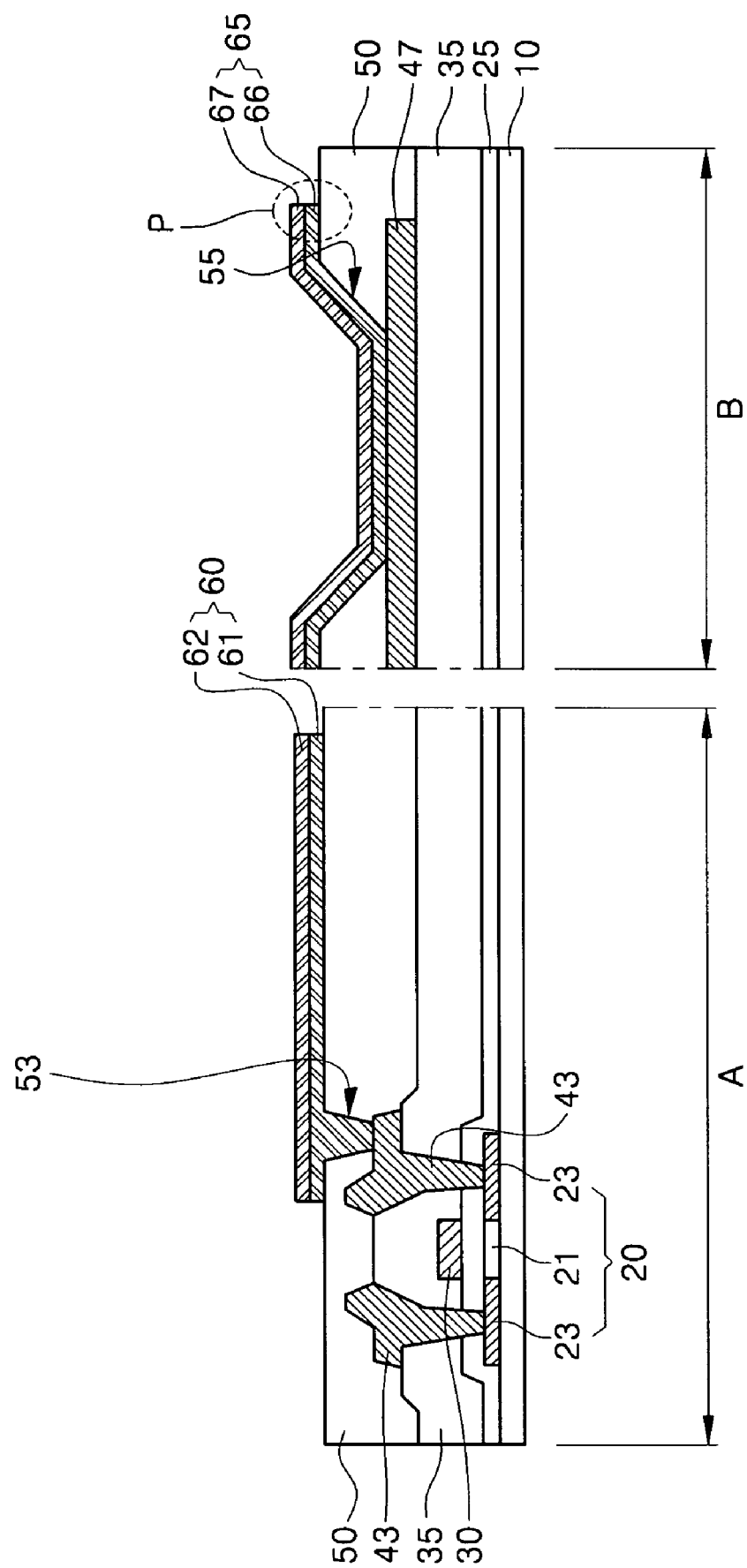
FIG. 1 is a cross-sectional view showing a conventional active-matrix OLED having a pixel electrode of a multilayer structure and method of fabricating the same.

In this exemplary embodiment, unlike the prior art, the pad area B does not have a terminal pad (65 of FIG. 1). This structure may prevent a reduction of pad reliability resulting from corrosion of the terminal pad. Since the corrosion is responsible for a galvanic phenomenon, improvement of the pad reliability may decrease a failure rate of the OLED. Further, the pad electrode 330 may be formed of a material that is insensitive to moisture, which may prevent corrosion of the pad electrode 330.

Figure 4:
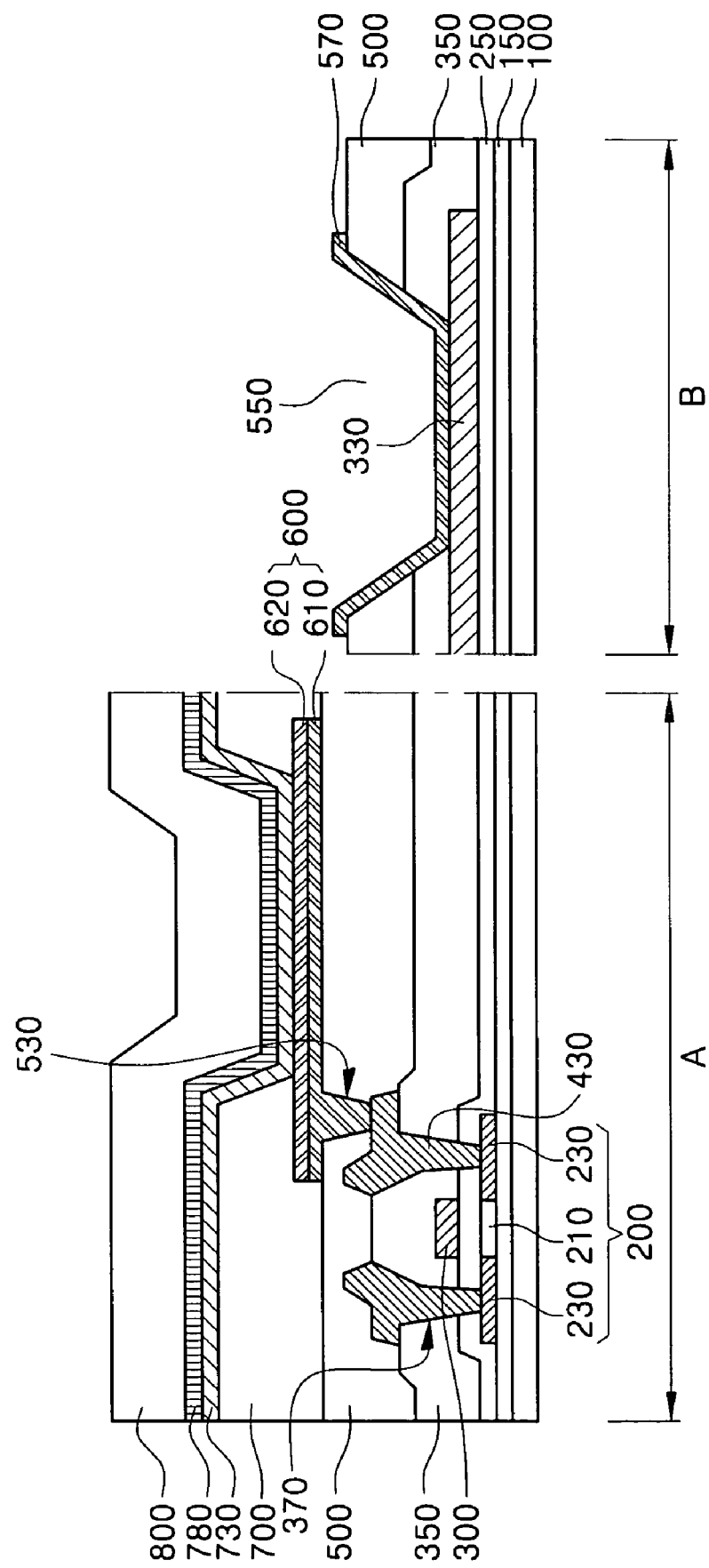
FIG. 4 is cross-sectional view illustrating an OLED according to a second exemplary embodiment of the present invention and method for fabricating the same.

FIG. 4 is a cross-sectional view illustrating an OLED according to a second exemplary embodiment of the present invention and method for fabricating the same. FIG. 4 is limited to the unit pixel of the display area A and the pad area B shown in FIG. 2. The OLED of the present embodiment has a different pad area structure than the first exemplary embodiment. Differences from the first exemplary embodiment are discussed below.

After forming and etching the planarization layer 500, a first pixel electrode layer is deposited on the planarization layer 500 by means of sputtering or vacuum deposition using a high precision mask, thereby providing the display area A with a first pixel electrode layer pattern 610 and the pad area B with a terminal pad 570. Thereafter, a second pixel electrode layer is deposited on the first pixel electrode layer pattern 610 by means of sputtering or vacuum deposition using another high precision mask, thereby forming a second pixel electrode layer pattern 620 on the first pixel electrode layer pattern 610, but a pattern is not formed on the terminal pad 570.

The terminal pad 570 contacts the pad electrode 330, which is exposed through the pad contact hole 550.

A pixel defining layer 700 is then formed on the entire surface of the substrate 100. Next, an opening is formed within the pixel defining layer 700 to expose a surface of the pixel electrode 600. Simultaneously, the pixel defining layer 700 is removed from the pad area B to expose the terminal pad 570. Next, an organic functional layer 730, having at least an emission layer, is formed on the portion of the pixel electrode 600 exposed in the opening. An opposite electrode 780 is formed on the organic emission layer 730.

A passivation layer 800 is formed on the entire surface of the substrate and then removed from the pad area B, thereby exposing the terminal pad 570.

The substrate is then encapsulated using the sealant and the encapsulation substrate (not shown). The pad area B is not encapsulated by the encapsulation substrate, and the exposed terminal pad 570 is coupled with the external module.

In this exemplary embodiment, the terminal pad 570 is formed of the same, single layer as the first pixel electrode layer 610, which may prevent a galvanic phenomenon caused by moisture in the air. As a result, it may be possible to prevent a decrease in pad reliability resulting from corrosion of the terminal pad (65 of FIG. 1). This improvement of the pad reliability may decrease a failure rate of the OLED.

Figure 5:
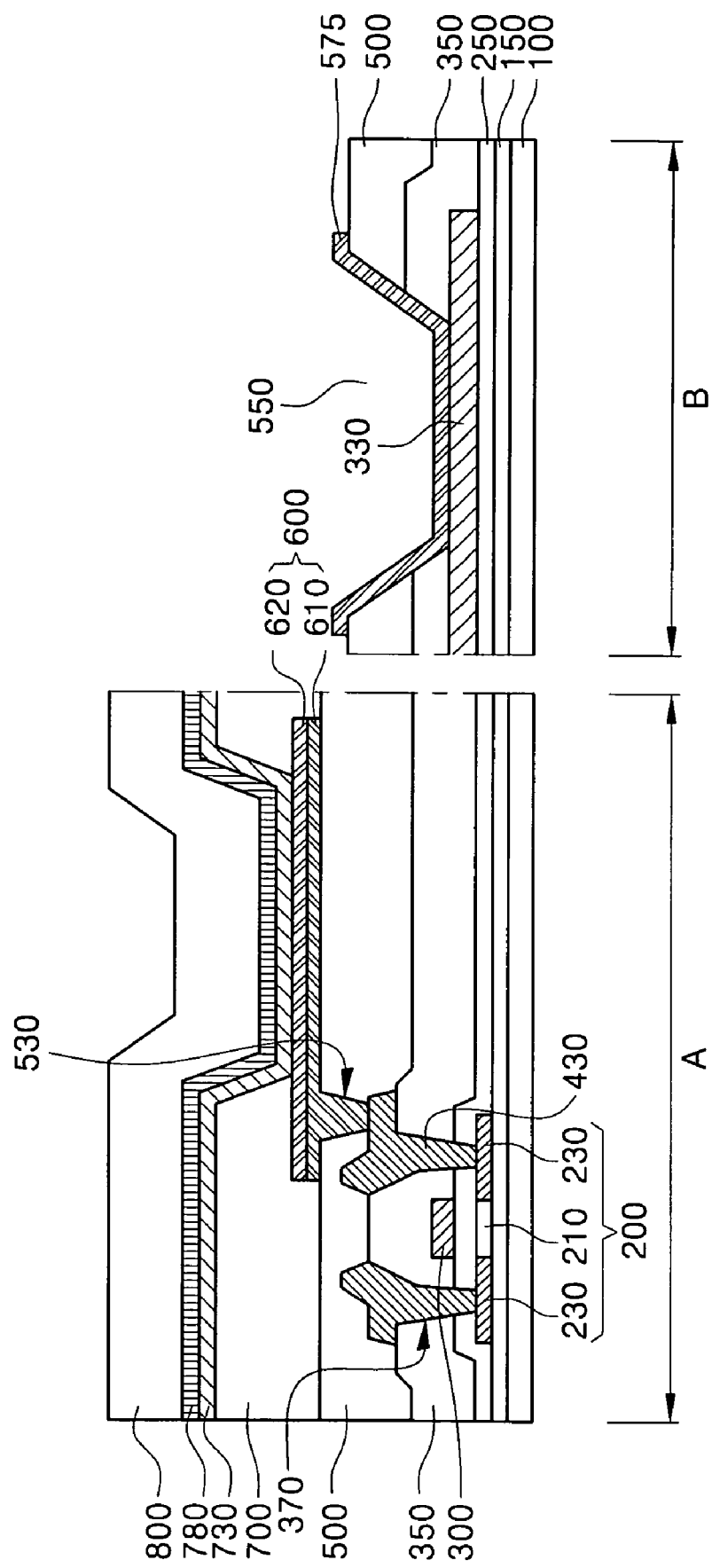
FIG. 5 is cross-sectional view illustrating an OLED according to a third exemplary embodiment of the present invention and method for fabricating the same.

FIG. 5 is a cross-sectional view illustrating an OLED according to a third exemplary embodiment of the present invention and method for fabricating the same. FIG. 5 is limited to the unit pixel of the display area A and the pad area B shown in FIG. 2. The OLED of the present embodiment has a different terminal pad structure than the second exemplary embodiment. Differences from the second exemplary embodiment are discussed below.

After forming and etching the planarization layer 500, a first pixel electrode layer is deposited on the planarization layer 500 by means of sputtering or vacuum deposition using a high precision mask, thereby providing the display area A with a first pixel electrode layer pattern 610, but a pattern is not formed on the pad area B. Next, a second pixel electrode layer is deposited on the planarization layer 500, including the first pixel electrode layer pattern 610, by means of sputtering or vacuum deposition using another high precision mask, thereby forming a second pixel electrode layer pattern 620 on the first pixel electrode layer pattern 610 and a terminal pad 575 on the pad electrode 330.

The terminal pad 575 contacts the pad electrode 330, which is exposed through the pad contact hole 550.

Except as described above, the OLED of the present embodiment is the same as set forth with reference to FIG. 4.

Figure 6A:
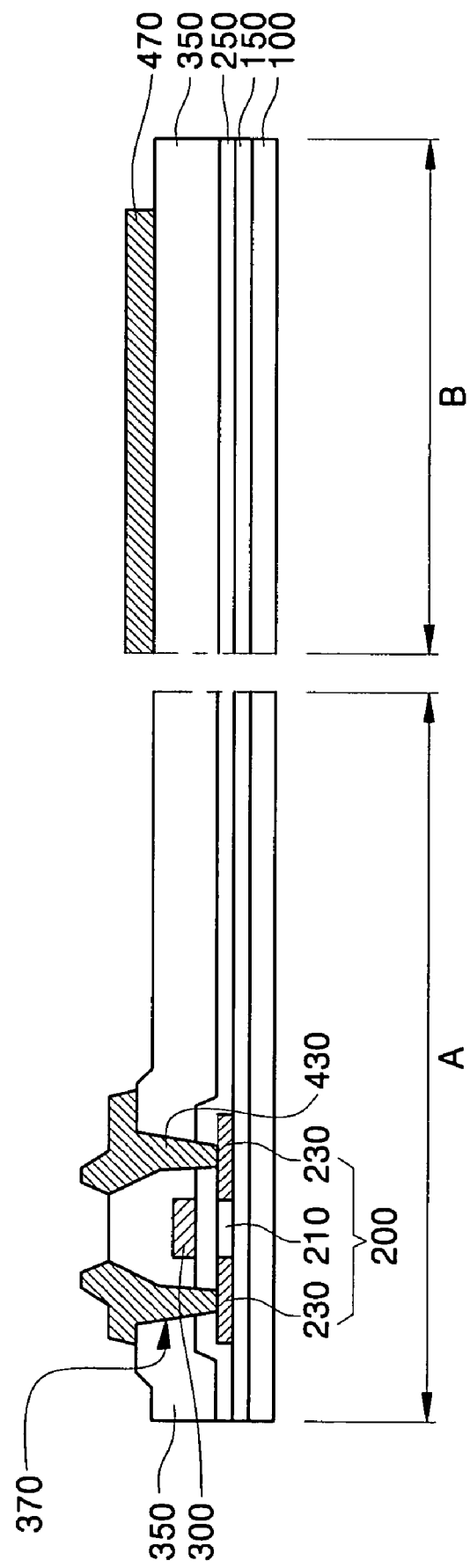

FIG. 6A and FIG. 6B are cross-sectional views illustrating an OLED according to a fourth exemplary embodiment of the present invention and method for fabricating the same. FIGS. 6A and 6B are limited to the unit pixel in the display area A and the pad area B shown in FIG. 2. The OLED of the present embodiment has a different pad area structure than the first embodiment. Differences from the first exemplary embodiment are discussed below.

Referring to FIG. 6A, a substrate 100 is provided with an active layer 200 and a gate insulating layer 250, which are formed by the same method as set forth with reference to FIG. 3A. A gate electrode layer is deposited and patterned on the gate insulating layer 250 to form a gate electrode 300 on the gate insulating layer 250 of the display area A.

Next, an interlayer 350 is formed on the entire surface of the substrate 100. The interlayer 350 has source/drain contact holes 370 that expose the source/drain regions 230. A source/drain electrode layer is then deposited and patterned on the interlayer 350 to simultaneously form source/drain electrodes 430, which are coupled to the source/drain regions 230, respectively, and a pad electrode 470 on the pad area B. The pad electrode 470 is coupled to the wiring (not shown) connecting the pad area B to the display area A. The wiring may be a common power supply wiring or data wiring. The source/drain electrodes 430 and the pad electrode 470 are preferably formed of a material that is insensitive to moisture and has excellent conductivity. More preferably, they are formed of a molybdenum alloy. Most preferably, the molybdenum alloy is a molybdenum-tungsten alloy.

Referring to FIG. 6B, a planarization layer 500 is formed on the entire surface of the substrate 100 and etched to form a via hole 530, which exposes any one of the source/drain electrodes 430, and a pad contact hole 550, which exposes the pad electrode 470.

Next, the OLED is fabricated by the same method as set forth with reference to FIG. 3E and FIG. 3F. Unlike the prior art, the OLED according to the present embodiment does not have a terminal pad (65 of FIG. 1), which may prevent a reduction of pad reliability due to corrosion of the terminal pad. Since the corrosion is responsible for the galvanic phenomenon, improvement of the pad reliability may decrease the failure rate of the OLED. Further, the pad elctrode 470 may be formed of a material that is insensitive to moisture, which may prevent corrosion of the pad electrode 470.

Figure 7:
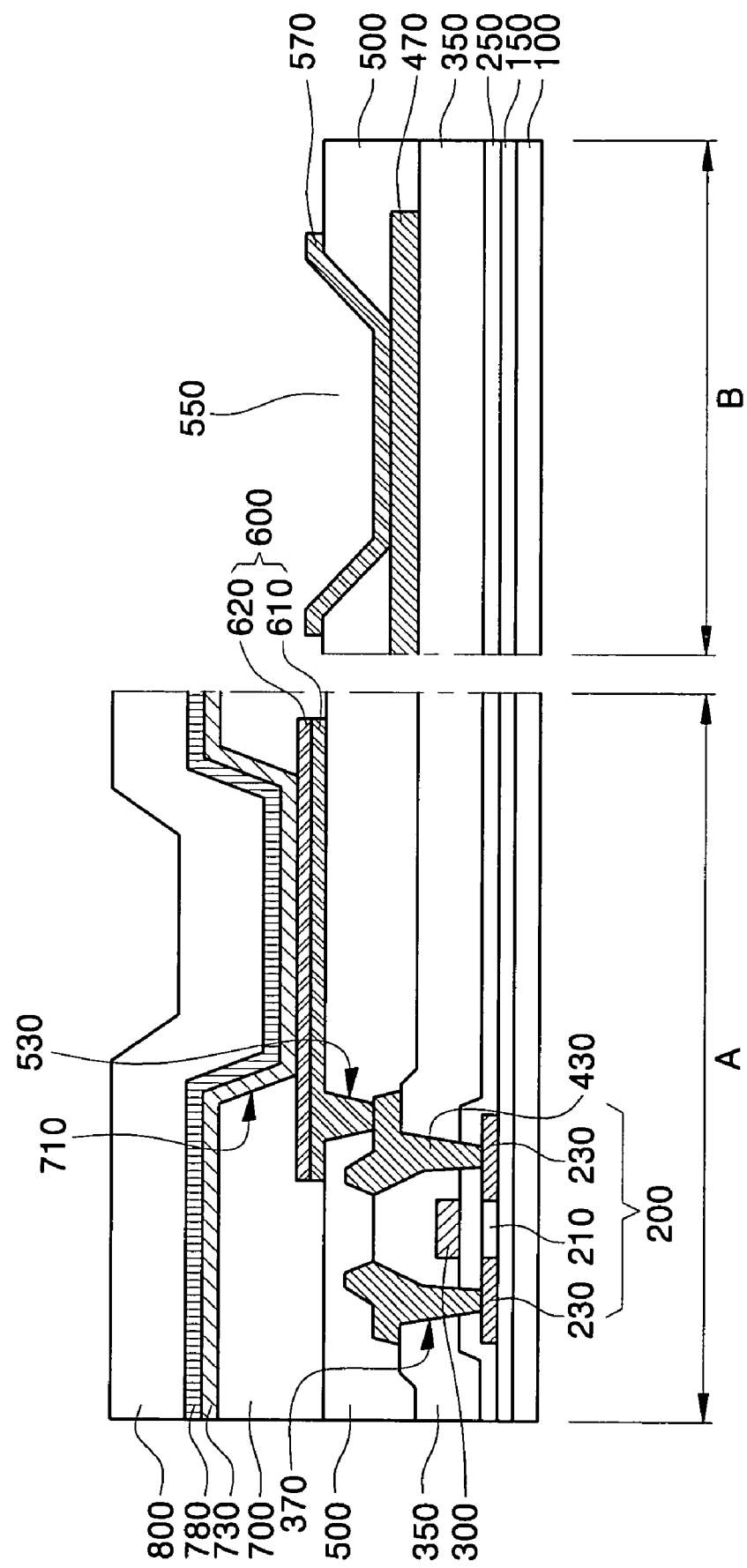
FIG. 7 is a cross-sectional view illustrating an OLED according to a fifth exemplary embodiment of the present invention and method for fabricating the same.

FIG. 7 is a cross-sectional view illustrating an OLED according to a fifth exemplary embodiment of the present invention and method for fabricating the same. FIG. 7 is limited to the unit pixel of the display area A and the pad area B shown in FIG. 2. The OLED of the present embodiment has a different pad area structure than the fourth exemplary. Differences is from the fourth exemplary embodiment are discussed below.

After forming and etching the planarization layer 500, a first pixel electrode layer is deposited on the planarization layer 500 by means of sputtering or vacuum deposition using a high precision mask, thereby providing the display area A with a first pixel electrode layer pattern 610 and the pad area B with a terminal pad 570. Next, a second pixel electrode layer is deposited on the first pixel electrode layer pattern 610 by means of sputtering or vacuum deposition using another high precision mask, thereby forming a second pixel electrode layer pattern 620 on the first pixel electrode layer pattern 610, but a pattern is not formed on the terminal pad 570.

The terminal pad 570 contacts the pad electrode 470, which is exposed through the pad contact hole 550.

A pixel defining layer 700 is then formed on the entire surface of the substrate 100. Next, an opening within the pixel defining layer 700 is formed exposing a surface of the pixel electrode 600. Simultaneously, the pixel defining layer 700 is removed from the pad area B to expose the terminal pad 570. Next, an organic functional layer 730, having at least an emission layer, is formed on the pixel electrode 600 exposed in the opening. An opposite electrode 780 is formed on the organic emission layer 730.

A passivation layer 800 is formed on the entire surface of the substrate and then removed from the pad area B, thereby exposing the terminal pad 570.

The display area A of the substrate is encapsulated using the sealant and the encapsulation substrate (not shown), but the pad area B is left exposed. The exposed terminal pad 570 may be coupled with the external module.

In this exemplary embodiment, the terminal pad 570 is formed of the same, single layer as the first pixel electrode layer 610, which may prevent a galvanic phenomenon caused by moisture in the air. This may prevent a decrease in pad reliability resulting from corrosion of the terminal pad (65 of FIG. 1), which may decrease the failure rate of the OLED.

Figure 8:
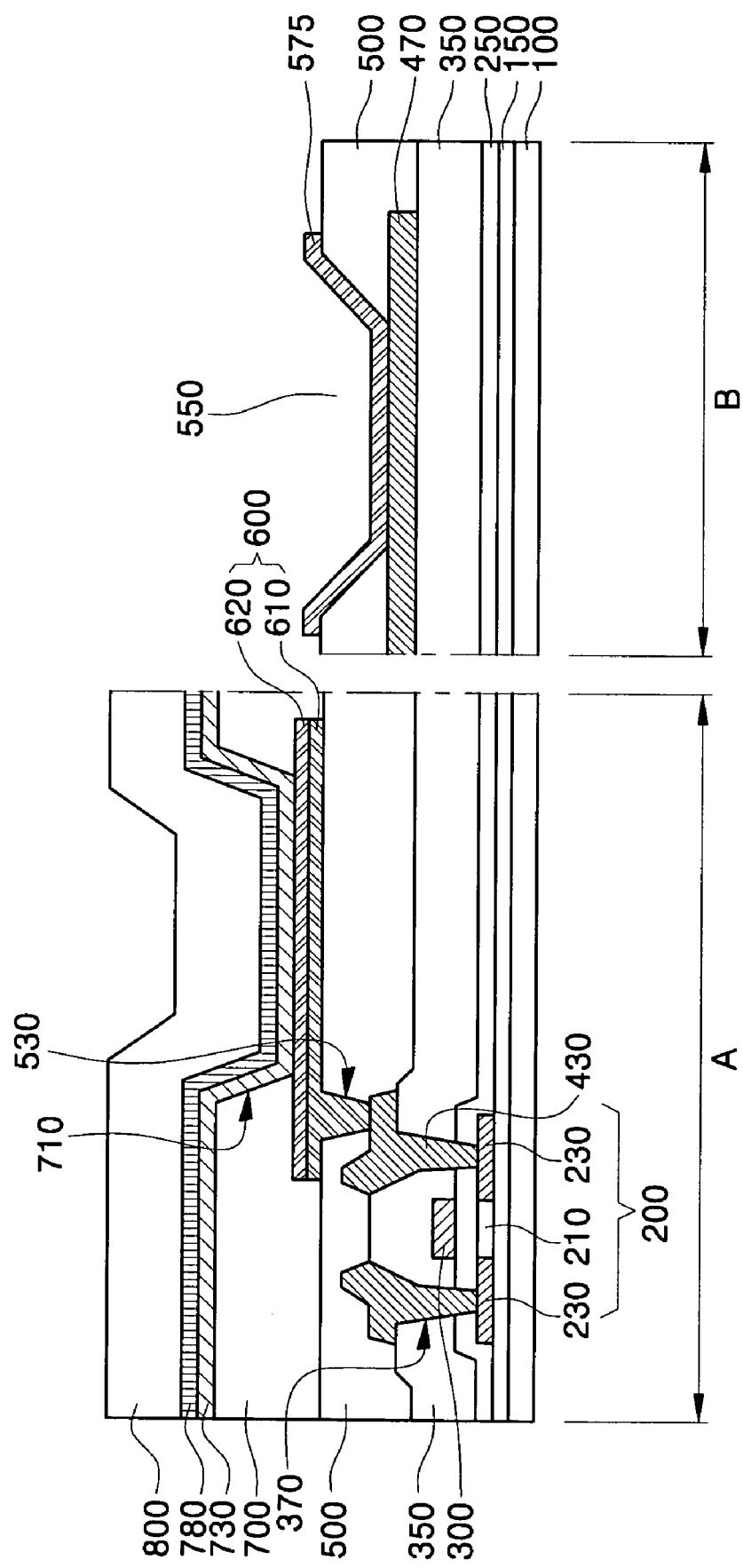
FIG. 8 is a cross-sectional view illustrating an OLED according to a sixth exemplary embodiment of the present invention and method for fabricating the same.

FIG. 8 is a cross-sectional view illustrating an OLED according to a sixth exemplary embodiment of the present invention and method for fabricating the same. FIG. 8 is limited to the unit pixel of the display area A and the pad area B shown in FIG. 2. The OLED of the present embodiment has a different terminal pad structure than the fifth exemplary embodiment. Differences from the fifth exemplary embodiment are discussed below.

After forming and etching the planarization layer 500, a first pixel electrode layer is deposited on the planarization layer 500 by means of sputtering or vacuum deposition using a high precision mask, thereby providing the display area A with a first pixel electrode layer pattern 610, but the pad area B is not provided with an additive pattern. Next, a second pixel electrode layer is deposited the planarization layer 500, including the first pixel electrode layer pattern 610, by means of sputtering or vacuum deposition using another high precision mask, thereby forming a second pixel electrode layer pattern 620 on the first pixel electrode layer pattern 610 and a terminal pad 575 on the pad electrode 470.

The terminal pad 575 contacts the pad electrode 470, which is exposed through the pad contact hole 550.

Except as described above, the OLED of the present embodiment is the same as set forth with reference to FIG. 7.

Figure 9B:
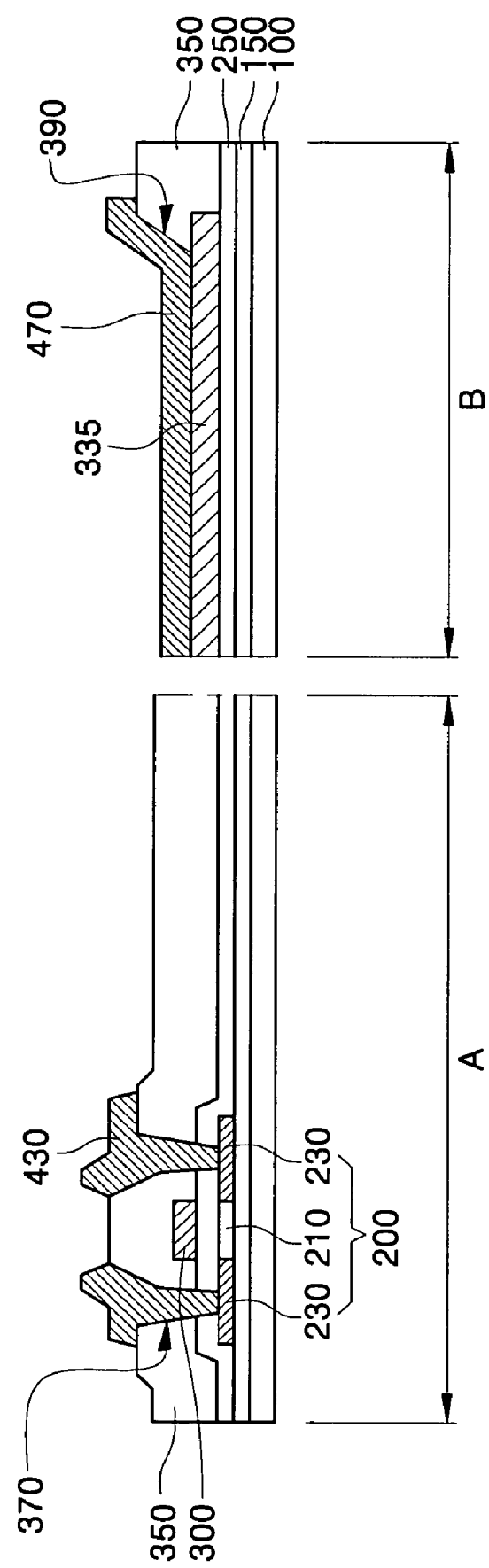
Figure 9C:
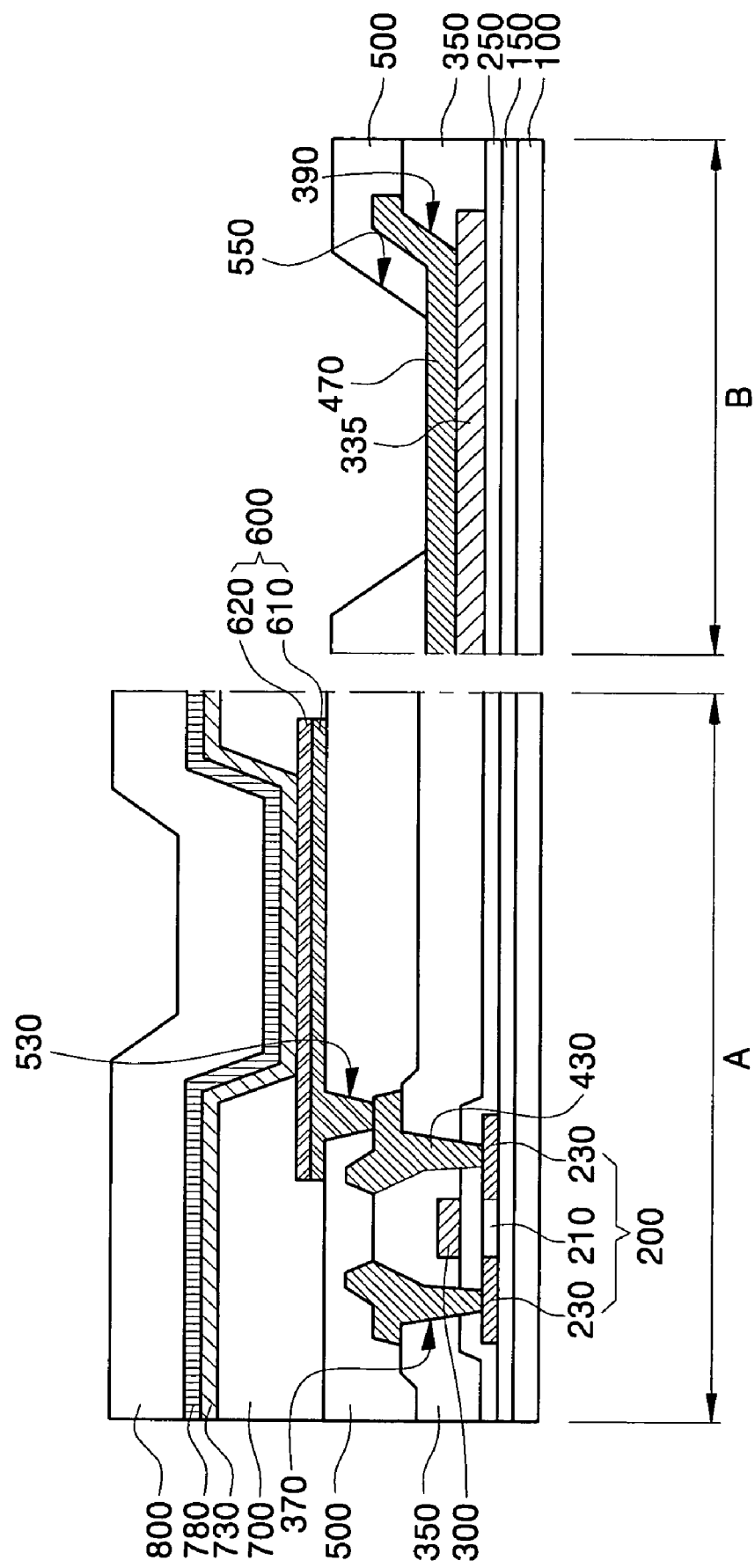

FIG. 9A, FIG. 9B and FIG. 9C are cross-sectional views explaining an OLED according to a seventh exemplary embodiment of the present invention and method for fabricating the same. FIGS. 9A through 9C are limited to the unit pixel in the display area A and the pad area B shown in FIG. 2. The OLED of the present embodiment has a different pad area structure than the previous exemplary embodiments.

Referring to FIG. 9A, a substrate 100 is provided with an active layer 200 and a gate insulating layer 250, which are formed by the same method as set forth with reference to FIG. 3A.

A gate electrode layer is deposited and patterned on the gate insulating layer 250 to simultaneously form a gate electrode 300 on the gate insulating layer 250 of the display area A and a gate pad 335 on the gate insulating layer 250 of the pad area B. Impurities are then injected into the active layer 200 using the gate electrode 300 as the mask thereby forming source/drain regions 230 and defining a channel region 210 between the source/drain regions 230.

An interlayer 350 is formed to cover the gate electrode 300 and the gate pad 335. The interlayer 350 is simultaneously provided with source/drain contact holes 370, which expose the source/drain regions 230, and a gate pad contact hole 390, which exposes the gate pad 335.

Referring to FIG. 9B, a source/drain electrode layer is then deposited and patterned on the interlayer 350 to form source/drain electrodes 430, which are coupled to the source/drain regions 230, respectively. At the same time, a pad electrode 470 is formed on the gate pad 335, which is exposed through the gate pad contact hole 390. The pad electrode 470 or the gate pad 335 may be electrically coupled with the wiring (not shown) connecting the pad area B and the display area A. The wiring may be a common power supply wiring or data wiring. The pad electrode 470 and the source/drain electrodes 430 are preferably formed of a material that is insensitive to moisture and has excellent conductivity. More preferably, they are formed of a molybdenum alloy. Most preferably, the molybdenum alloy is a molybdenum-tungsten alloy.

Referring to FIG. 9C, a planarization layer 500 is formed on the entire surface of the substrate 100, and etched to form a via hole 530, which exposes any one of the source/drain electrodes 430, and a pad contact hole 550, which exposes the pad electrode 470.

The OLED is then fabricated by the same method as set forth with reference to FIG. 3E and FIG. 3F. Unlike the prior art, the OLED according to the seventh exemplary embodiment does not have a terminal pad (65 of FIG. 1), which may prevent a reduction of pad reliability resulting from corrosion of the terminal pad. Since the corrosion is responsible for the galvanic phenomenon, improvement of the pad reliability may decrease the failure rate of the OLED. Further, the pad electrode 470 may be formed of a material that is insensitive to moisture, which may prevent corrosion of the pad electrode 470.

FIG. 10 is cross-sectional view illustrating an OLED according to an eighth exemplary embodiment of the present invention and method for fabricating the same. FIG. 10 is limited to the unit pixel of the display area A and the pad area B shown in FIG. 2. The OLED according to the eighth exemplary embodiment has a different pad area structure than the seventh exemplary embodiment. Differences from the seventh exemplary embodiment are discussed below.

After forming and etching the planarization layer 500, a first pixel electrode layer is deposited on the planarization layer 500 by means of sputtering or vacuum deposition using a high precision mask, thereby providing the display area A with a first pixel electrode layer pattern 610 and the pad area B with a terminal pad 570. Next, a second pixel electrode layer is deposited on the first pixel electrode layer pattern 610 by means of sputtering or vacuum deposition using another high precision mask, thereby forming a second pixel electrode layer pattern 620 on the first pixel electrode layer pattern 610, but a pattern is not formed on the terminal pad 570.

A pixel defining layer 700 is formed on the entire surface of the substrate 100. An opening within the pixel defining layer 700 is then formed to expose a surface of the pixel electrode 600. Simultaneously, the pixel defining layer 700 is removed from the pad area B to expose the terminal pad 570. Next, an organic functional layer 730, having at least an emission layer, is formed on the pixel electrode 600 exposed in the opening. An opposite electrode 780 is formed on the organic emission layer 730.

Then, a passivation layer 800 is formed on the entire surface of the substrate and then removed from the pad area B, thereby exposing the terminal pad 570.

The substrate is encapsulated using the sealant and the encapsulation substrate (not shown), but the pad area B is left exposed. The exposed terminal pad 570 is coupled with the external module.

In this exemplary embodiment, the terminal pad 570 is formed of the same, single layer as the first pixel electrode layer 610, which may prevent a galvanic phenomenon caused by moisture in the air. This may prevent a decrease in pad reliability resulting from corrosion of the terminal pad (65 of FIG. 1). The improvement in pad reliability may decrease the failure rate of the OLED.

Figure 11:
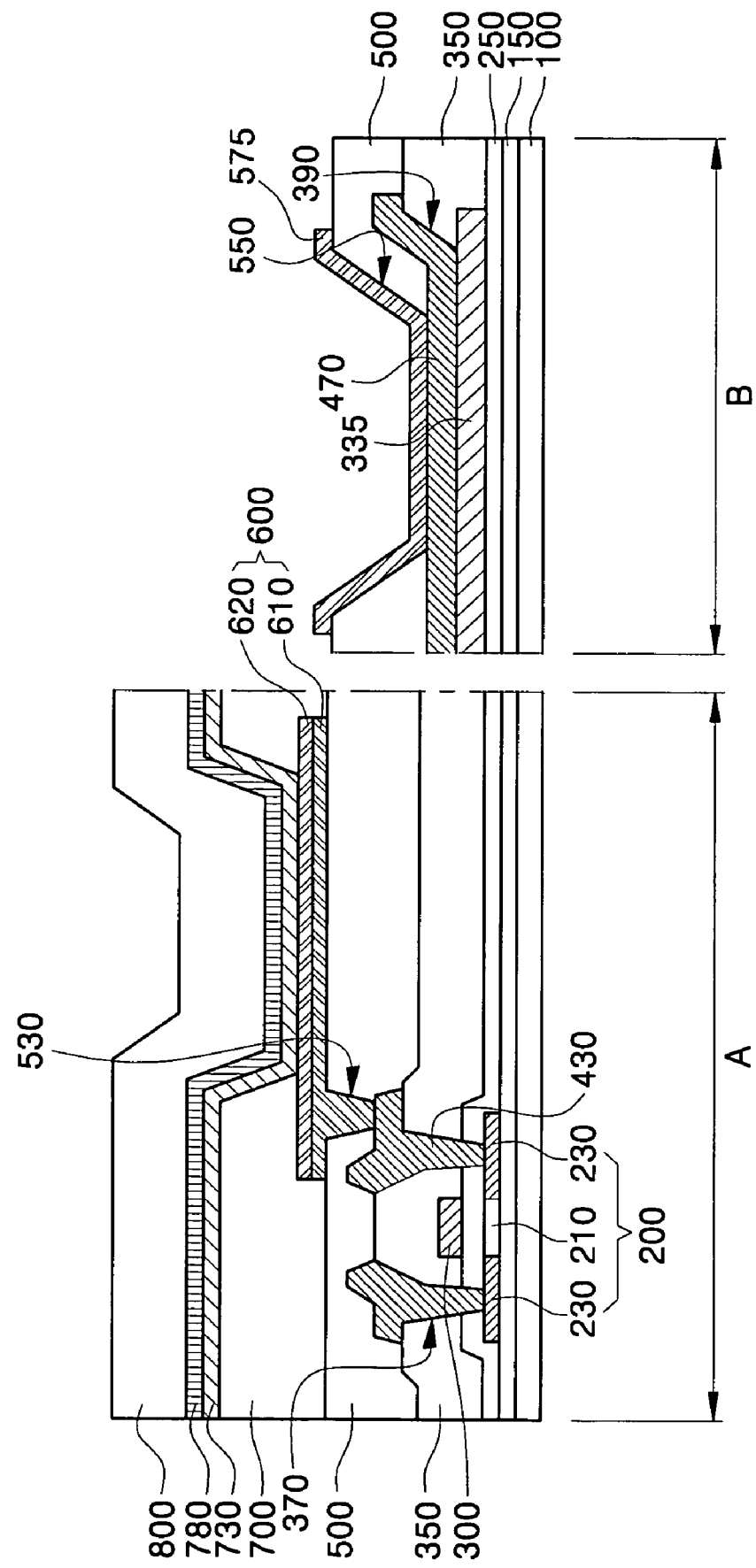
FIG. 11 is a cross-sectional view illustrating an OLED according to a ninth exemplary embodiment of the present invention and method for fabricating the same.

FIG. 11 is a cross-sectional view illustrating an OLED according to a ninth embodiment of the present invention and method for fabricating the same. FIG. 11 is limited to the unit pixel of the display area A and the pad area B shown in FIG. 2. The OLED of the present embodiment has a different terminal pad structure than the eighth exemplary embodiment. Differences from the eighth exemplary embodiment are discussed below.

After forming and etching the planarization layer 500, a first pixel electrode layer is deposited on the planarization layer 500 by means of sputtering or vacuum deposition using a high precision mask, thereby providing the display area A with a first pixel electrode layer pattern 610, but a pattern is not added to the pad area B. Next, a second pixel electrode layer is deposited the planarization layer 500, including the first pixel electrode layer pattern 610, by means of sputtering or vacuum deposition using another high precision mask, thereby forming a second pixel electrode layer pattern 620 on the first pixel electrode layer pattern 610 and a terminal pad 575 on the pad electrode 470.

The terminal pad 575 contacts the pad electrode 470, which is exposed through the pad contact hole 550.

Except as described above, the OLED of the present embodiment is the same as set forth with reference to FIG. 10.

Hereinafter, an example is described in order to help understand the present invention.

EXAMPLE

An OLED was prepared identically to that in the fourth embodiment. The pad electrode (470 of FIG. 6B) was formed of the molybdenum tungsten alloy, and was exposed through the pad contact hole (550 of FIG. 6B).

COMPARATIVE EXAMPLE

Except that a terminal pad having an AlNd layer and an ITO layer was formed on the pad electrode (470 of FIG. 6B) at the same time as the pixel electrode (600 of FIG. 6B) was formed of the same layers, an OLED was prepared identically to that of the Example.

Table 1 below shows a failure rate of ten OLEDs. Five were based on the Example and five were based on the Comparative Example. The OLEDs were maintained at 85° C. and a relative humidity of 95% for 100 hours.

TABLE 1

|  | Example | Comparative Example |
| --- | --- | --- |
| Failure rate | 0% (0/5) | 100% (5/5) |

Referring to Table 1, the five Example OLEDs did not generate any defects in their pads. On the other hand, all five Comparative Example OLEDs generated defects in their pads. Thus, the Example OLEDs had a 100% improvement in the failure rate as compared to the Comparative Example OLEDs.

As set forth above, according to exemplary embodiments of the present invention, the pad area B may not have a terminal pad, or if it does have a terminal pad (570 of FIGS. 4, 7 and 10 or 575 of FIGS. 5, 8 and 11), then it may be formed of the same, single layer as any one of the conductive thin layers comprising the pixel electrode 600. Therefore, it may be possible to prevent a galvanic phenomenon caused by moisture in the air, which may prevent a reduction of pad reliability due to corrosion of the terminal pad. The improvement of the pad reliability may decrease a failure rate of the OLED. Furthermore, when the terminal pad is not formed, the pad electrode may be formed of a material that is insensitive to moisture, which may prevent corrosion of the pad electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting display (OLED), comprising:
   a substrate;
   a display area on the substrate;
   a pad area on the substrate and spaced apart from the display area;
   a thin film transistor disposed on the display area and having an active layer, a gate electrode, a source electrode and a drain electrode;
   a pixel electrode electrically coupled to the thin film transistor, wherein the pixel electrode has at least two conductive layers; and
   a pad electrode disposed on the pad area,
   wherein the pad electrode is formed of a same layer as a gate electrode layer or a source/drain electrode layer, wherein the pad electrode is coupled with an external module.

2. The OLED of claim 1, further comprising:
   a gate pad formed of a same layer as the gate electrode layer and formed under the pad electrode,
   wherein the pad electrode is formed of the same layer as the source/drain electrode layer.

3. The OLED of claim 1, wherein the external module is a Chip on Glass or a Flexible Printed Circuit.

4. The OLED of claim 1, wherein the two conductive layers are a conductive reflection layer and a conductive transparent layer.

5. The OLED of claim 4, wherein the conductive transparent layer is formed of indium tin oxide (ITO) or indium zinc oxide (IZO).

6. The OLED of claim 4, wherein the conductive reflection layer is formed of any one selected from a group of aluminum (Al), aluminum alloy, silver (Ag), silver alloy, and their alloys.

7. The OLED of claim 6, wherein the conductive reflection layer is formed of aluminum-neodymium (AlNd).

8. The OLED of claim 1, wherein the pad electrode is formed of a molybdenum alloy.

9. The OLED of claim 8, wherein the molybdenum alloy is a molybdenum-tungsten alloy.

10. An organic light-emitting display (OLED), comprising:
    a substrate;
    a display area on the substrate;
    a pad area on the substrate and spaced apart from the display area;
    at least one thin film transistor disposed on the display area and having an active layer, a gate electrode, a source electrode and a drain electrode;
    a pixel electrode electrically coupled to the thin film transistor, and formed of at least two conductive layers;
    a pad electrode disposed on the pad area; and
    a terminal pad disposed on the pad electrode,
    wherein the pad electrode is formed of a same layer as a gate electrode layer or a source/drain electrode layer;
    wherein the terminal pad is formed of the same layer as any one of the conductive layers,
    wherein the terminal pad is coupled with an external module.

11. The OLED of claim 10, further comprising:
    a gate pad formed of a same layer as the gate electrode layer and formed under the pad electrode,
    wherein the pad electrode is formed of the same layer as the source/drain electrode layer.

12. The OLED of claim 10, wherein the external module is a Chip on Glass or a Flexible Printed Circuit.

13. The OLED of claim 10, wherein the pad electrode is formed of a molybdenum alloy.

14. The OLED of claim 13, wherein the molybdenum alloy is a molybdenum-tungsten alloy.

15. The OLED of claim 10, wherein the two conductive layers are a conductive reflection layer and a conductive transparent layer.

16. The OLED of claim 15, wherein the conductive transparent layer is formed of indium tin oxide (ITO) or indium zinc oxide (IZO).

17. The OLED of claim 15, wherein the conductive reflection layer is formed of any one selected from a group of aluminum (Al), aluminum alloy, silver (Ag), silver alloy, and their alloys.

18. The OLED of claim 17, wherein the conductive reflection layer is formed of aluminum-neodymium (AlNd).

19. The OLED of claim 15, wherein the terminal pad is formed of the conductive reflection layer or the conductive transparent layer.

20. The OLED of claim 19, wherein the conductive transparent layer is formed of ITO or IZO.

21. A fabrication method of an organic light-emitting display (OLED), comprising:
providing a substrate having a display area and a pad area spaced apart from the display area;
forming a thin film transistor having an active layer, a gate electrode, a source electrode, and a drain electrode on the display area;
forming a pad electrode on the pad area with forming the gate electrode or the source/drain electrodes; and
forming a pixel electrode electrically coupled to the thin film transistor and exposing the pad electrode, wherein the pixel electrode has at least two conductive layers.

22. The method of claim 21, wherein the pad electrode is formed of a molybdenum alloy.

23. The method of claim 21, further comprising:
forming a gate pad with forming the gate electrode before forming the pad electrode,
wherein the pad electrode is formed with forming the source/drain electrode on the gate pad.

24. The method of claim 21, wherein the two conductive layers are a conductive reflection layer and a conductive transparent layer.

25. The method of claim 24, wherein the conductive reflection layer is formed of any one selected from a group of aluminum (Al), aluminum alloy, silver (Ag), silver alloy, and their alloys.

26. The method of claim 24, wherein the conductive transparent layer is formed of indium tin oxide (ITO) or indium zinc oxide (IZO).

27. A fabrication method of an organic light-emitting display (OLED), comprising:
providing a substrate having a display area and a pad area spaced apart from the display area;
forming a thin film transistor having an active layer, a gate electrode, a source electrode and a drain electrode on the display area;
forming a pad electrode on the pad area with forming the gate electrode or the source/drain electrodes;
forming a pixel electrode having at least two conductive layers and electrically coupled to the thin film transistor; and
forming a terminal pad on the pad electrode with forming the any one of the conductive layers.

28. The method of claim 27, wherein the pad electrode is formed of a molybdenum alloy.

29. The OLED of claim 27, further comprising:
forming a gate pad with forming the gate electrode before forming the pad electrode,
wherein the pad electrode is formed with forming the source/drain electrode on the gate pad.

30. The method of claim 27, wherein the two conductive layers are a conductive reflection layer and a conductive transparent layer.

31. The method of claim 30, wherein the conductive reflection layer is formed of any one selected from a group of aluminum (Al), aluminum alloy, silver (Ag), silver alloy, and their alloys.

32. The method of claim 30, wherein the conductive transparent layer is formed of indium tin oxide (ITO) or indium zinc oxide (IZO).

33. The method of claim 30, wherein the terminal pad is formed of the conductive reflection layer or the conductive transparent layer.

* * * * *